United States Patent
Fayrushin

(10) Patent No.: US 7,968,407 B2
(45) Date of Patent: Jun. 28, 2011

(54) METHODS OF MANUFACTURING SEMICONDUCTOR MEMORY DEVICES

(75) Inventor: Albert Fayrushin, Suwon-si (KR)

(73) Assignee: Samsung Electronics Co., Ltd., Suwon-si-, Gyeonggi-do (KR)

( * ) Notice: Subject to any disclaimer, the term of this patent is extended or adjusted under 35 U.S.C. 154(b) by 0 days.

(21) Appl. No.: 12/752,409

(22) Filed: Apr. 1, 2010

(65) Prior Publication Data

US 2010/0184282 A1   Jul. 22, 2010

Related U.S. Application Data

(63) Continuation-in-part of application No. 12/137,976, filed on Jun. 12, 2008.

(30) Foreign Application Priority Data

Jun. 14, 2007 (KR) .................. 10-2007-0058235
Apr. 1, 2009 (KR) .................. 10-2009-0028219

(51) Int. Cl.
    *H01L 21/336* (2006.01)
(52) U.S. Cl. ........ 438/261; 438/142; 438/197; 438/200; 438/217; 438/288; 257/E21.682
(58) Field of Classification Search .................. None
    See application file for complete search history.

(56) References Cited

U.S. PATENT DOCUMENTS

| | | | |
|---|---|---|---|
| 5,889,304 A | 3/1999 | Watanabe et al. | |
| 6,034,395 A | 3/2000 | Tripsas et al. | |
| 6,281,050 B1* | 8/2001 | Sakagami | 438/142 |
| 6,927,447 B2 | 8/2005 | Choi et al. | |
| 6,933,198 B2 | 8/2005 | Chu et al. | |
| 7,348,267 B2 | 3/2008 | Eun et al. | |
| 2005/0116279 A1 | 6/2005 | Koh | |
| 2005/0255654 A1* | 11/2005 | Lee et al. | 438/264 |
| 2006/0192245 A1 | 8/2006 | Oosawa | |
| 2007/0148872 A1* | 6/2007 | Jung | 438/264 |

FOREIGN PATENT DOCUMENTS

| | | |
|---|---|---|
| JP | 10-022403 A | 1/1998 |
| JP | 2006-237434 A | 9/2006 |
| KR | 10-2002-0050918 A | 6/2002 |
| KR | 10-2006-0124863 A | 12/2006 |
| KR | 10-0655289 B1 | 12/2006 |

* cited by examiner

*Primary Examiner* — N Drew Richards
*Assistant Examiner* — Kyoung Lee
(74) *Attorney, Agent, or Firm* — Lee & Morse, P.C.

(57) ABSTRACT

A method of manufacturing a semiconductor memory device, the method including forming a tunnel insulation layer on a substrate, forming a preliminary charge trapping layer on the tunnel insulation layer, forming an etch stop layer on the preliminary charge trapping layer, wherein a portion of the preliminary charge trapping layer is not covered by the etch stop layer, removing the exposed portion of the preliminary charge trapping layer to form a charge trapping layer having a uniform thickness, forming a dielectric layer on the charge trapping layer, and forming a gate electrode on the dielectric layer.

10 Claims, 11 Drawing Sheets

METHODS OF MANUFACTURING SEMICONDUCTOR MEMORY DEVICES

CROSS-REFERENCE TO RELATED APPLICATION

This application is a Continuation-in-Part of pending U.S. patent application Ser. No. 12/137,976, entitled "SEMICONDUCTOR MEMORY DEVICES AND METHODS OF MANUFACTURING THE SAME," filed on Jun. 12, 2008, the disclosure of which is incorporated herein by reference in its entirety.

BACKGROUND

1. Field

Embodiments relate to methods of manufacturing semiconductor memory devices.

2. Description of the Related Art

Flash memory devices may be classified into a charge trapping layer flash memory device and a charge trap flash memory device. The charge trap flash memory device may have a gate structure including a charge trapping layer, while the charge trapping layer flash memory device may have a gate structure including a charge trapping layer.

The gate structure of the charge trap flash memory device may have a stacked structure in which a charge trapping layer, a dielectric layer and a gate electrode are sequentially stacked on a tunnel insulation layer pattern. Charges that have tunneled through the tunnel insulation layer may be trapped in the charge trapping layer, and the dielectric layer may prevent the charges from moving to the gate electrode.

SUMMARY

It is a feature of an embodiment to provide methods of manufacturing flash memory devices including a charge trapping layer having uniform thickness.

At least one of the above and other features and advantages may be realized by providing a method of manufacturing a semiconductor memory device, the method including forming a tunnel insulation layer on a substrate, forming a preliminary charge trapping layer on the tunnel insulation layer, forming an etch stop layer on the preliminary charge trapping layer, wherein a portion of the preliminary charge trapping layer is not covered by the etch stop layer, removing the exposed portion of the preliminary charge trapping layer to form a charge trapping layer having a uniform thickness, forming a dielectric layer on the charge trapping layer, and forming a gate electrode on the dielectric layer.

Forming the preliminary charge trapping layer may include performing an isotropic etching process on the preliminary charge trapping layer.

The method may further include removing the etch stop layer after removing the exposed portion of the preliminary charge trapping layer.

The method may further include, prior to forming the tunnel insulation layer, sequentially forming a pad layer pattern and a mask on the substrate, partially removing the substrate using the mask and the pad layer pattern as an etching mask to form a trench defining an active region in the substrate, forming an isolation layer in the trench, and removing the mask and the pad layer pattern to form an opening exposing the active region, wherein the tunnel insulation layer is formed on the exposed active region.

Removing the mask and the pad layer pattern to form the opening may include performing a wet etching process, and a portion of the isolation layer may be removed in the wet etching process.

The preliminary charge trapping layer may be formed on a bottom and a sidewall of the opening.

The method may further include, after forming the etch stop layer, removing an upper portion of the isolation layer so that a portion of the preliminary charge trapping layer is exposed.

Removing the upper portion of the isolation layer may include removing the upper portion of the isolation layer until a top surface of the isolation layer has a height substantially the same as a height of a lowermost portion of the etch stop layer.

Removing the upper portion of the isolation layer may include removing the upper portion of the isolation layer until a top surface of the isolation layer has a height substantially the same as, or higher than, that of a lowermost point of the preliminary charge trapping layer.

At least one of the above and other features and advantages may also be realized by providing a method of manufacturing a semiconductor memory device, the method including forming a mask on a substrate, partially removing the substrate using the mask as an etching mask to form a trench defining an active region in the substrate, forming an isolation layer in the trench, removing the mask to form an opening exposing the active region, forming a preliminary charge trapping layer on a bottom and a sidewall of the trench and on the isolation layer, forming an etch stop layer on the preliminary charge trapping layer, removing an upper portion of the etch stop layer and an upper portion of the preliminary charge trapping layer on the isolation layer, removing a portion of the isolation layer, partially removing the preliminary charge trapping layer to form a charge trapping layer having a substantially uniform thickness, forming a dielectric layer on the charge trapping layer, and forming a gate electrode on the dielectric layer.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
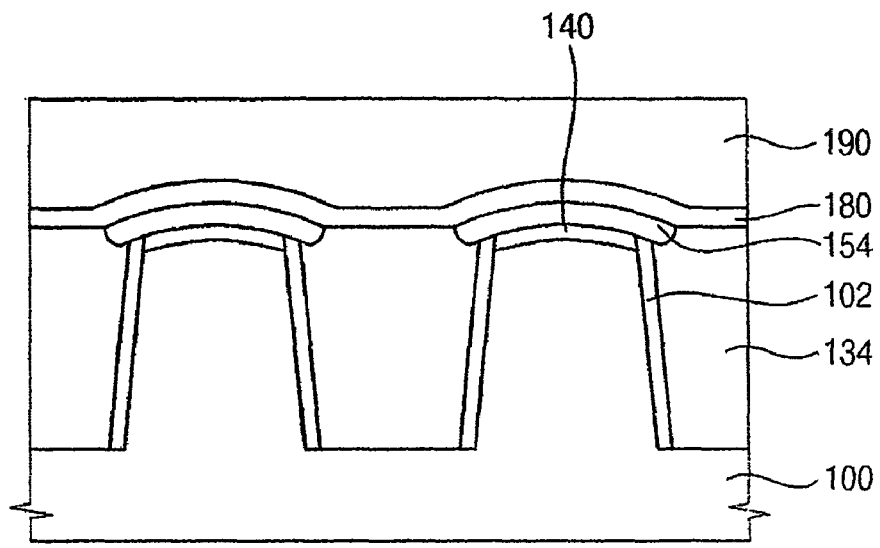
FIG. 1 illustrates a cross-sectional view of a non-volatile memory device in accordance with some embodiments.

Korean Patent Application Nos. 10-2007-0058235, filed on Jun. 14, 2007, and entitled: "Memory Device Including the Floating Gate Having the Uniform Thickness and the Manufacturing Method Thereof," and 10-2009-0028219, filed on Apr. 1, 2009, in the Korean Intellectual Property Office, and entitled: "Methods of Manufacturing Semiconductor Memory Devices," are incorporated by reference herein in their entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the Example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

FIG. 1 illustrates a cross-sectional view of a non-volatile memory device in accordance with some embodiments.

Referring to FIG. 1, the non-volatile memory device according to some embodiments may include a tunnel insulation layer 140, a first charge trapping layer 154, a dielectric layer 180 and a gate electrode 190 on a substrate 100.

The substrate 100 may include a silicon substrate, a germanium substrate, a silicon-on-insulator (SOI) substrate, a germanium-on-insulator (GOI) substrate, etc. The substrate 100 may be divided into an active region and a field region. The active region may have a shape vertically protruded from a plane on which the substrate 100 is placed.

The tunnel insulation layer 140 may be formed on the active region. The tunnel insulation layer 140 may be formed by performing a thermal oxidation process on a top surface of the active region.

A first isolation layer 134 may be formed on the field region between the active regions. The first isolation layer 134 may include USG oxide, $O_3$-Tetra Ethyl Ortho Silicate Undoped Silicate Glass ($O_3$-TEOS) oxide, HDP oxide, etc.

An oxide layer 102 may be formed on a sidewall of the active region making contact with the isolation layer 134. The oxide layer 102 may be formed by thermally oxidizing the sidewall of the active region. Alternatively, the oxide layer 102 may not be formed.

The first charge trapping layer 154 may be formed on the tunnel insulation layer 140 and the oxide layer 102. Additionally, the first charge trapping layer 154 may be formed on a portion of the isolation layer 134. In some embodiments, the first charge trapping layer 154 may have a peripheral portion having a height lower than that of a central portion thereof. The first charge trapping layer 154 may include polysilicon and/or doped polysilicon.

The first charge trapping layer 154 may have a substantially uniform thickness. Thus, the charge trapping layer coupling between the adjacent first charge trapping layers 154 on neighboring bit lines (not shown) may be more uniform, and the non-volatile memory device including the first charge trapping layer 154 may have more uniform operating characteristics.

The dielectric layer 180 may be formed on the first charge trapping layer 154 and the isolation layer 134. The dielectric layer 180 may include a high-k material, and may have a multi-stack structure including an oxide layer/nitride layer/oxide layer structure.

The gate electrode 190 may be formed on the dielectric layer 180. The gate electrode 190 may include doped polysilicon and/or a metal silicide. Examples of the metal silicide may include tungsten silicide ($WSi_x$), titanium silicide ($TiSi_x$), cobalt silicide ($CoSi_x$), tantalum silicide ($TaSi_x$), etc.

Figure 2:
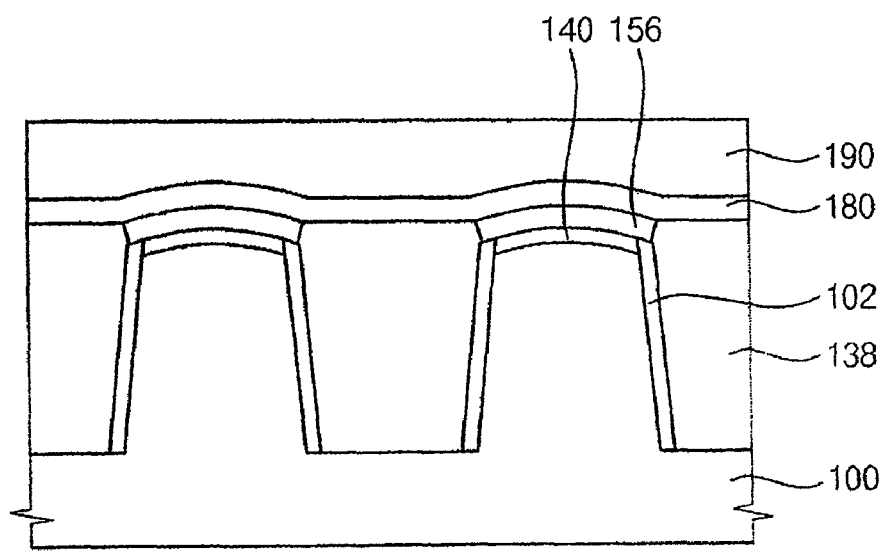
FIG. 2 illustrates a cross-sectional view of a non-volatile memory device in accordance with some other embodiments.

FIG. 2 illustrates a cross-sectional view of a non-volatile memory device in accordance with some other embodiments. The non-volatile memory device in FIG. 2 is substantially the same as or very similar to that illustrated in FIG. 1, except the non-volatile memory device in FIG. 2 has a second charge trapping layer 156 instead of the first charge trapping layer 154. Thus, only the second charge trapping layer 156 is described in detail herein in order to avoid repetitions.

Referring to FIG. 2, the second charge trapping layer 156 may be formed on the tunnel insulation layer 140 and the oxide layer 102. The second charge trapping layer 156 may not be substantially formed over a second isolation layer 138. In some embodiments, the second charge trapping layer 156 may have a peripheral portion having a height lower than that of a central portion thereof. The second charge trapping layer 156 may include polysilicon and/or doped polysilicon.

The second charge trapping layer 156 may have a substantially uniform thickness like the first charge trapping layer 154. Thus, the charge trapping layer coupling between the adjacent second charge trapping layers 156 on neighboring bit lines (not shown) may be more uniform, and the non-volatile memory device including the second charge trapping layer 156 may have more uniform operating characteristics.

Figure 3A:
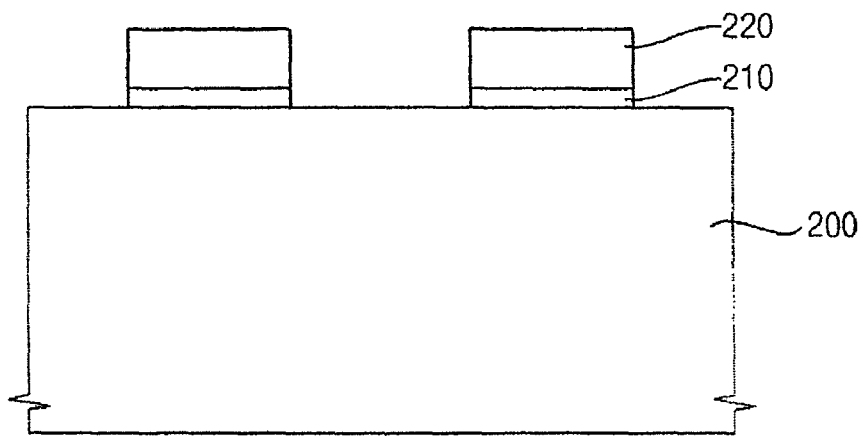
FIGS. 3A to 3N illustrate cross-sectional views of methods of manufacturing non-volatile memory devices in accordance with some embodiments.
Figure 3B:
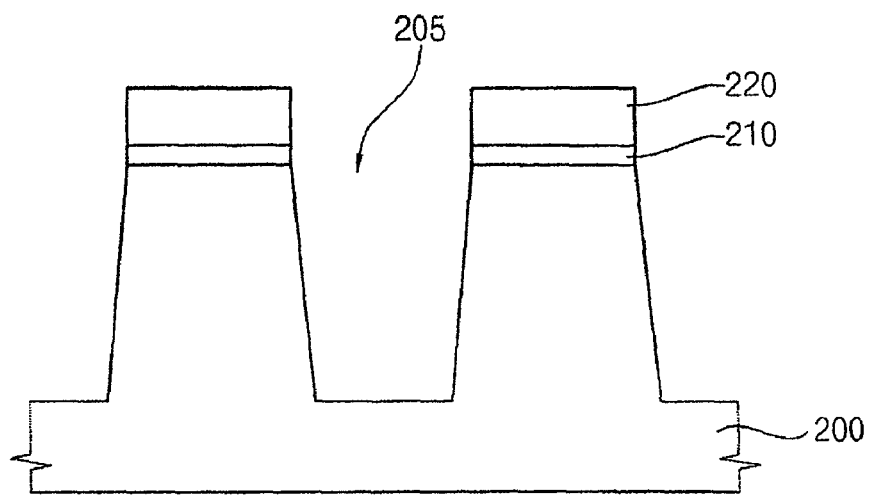
Figure 3C:
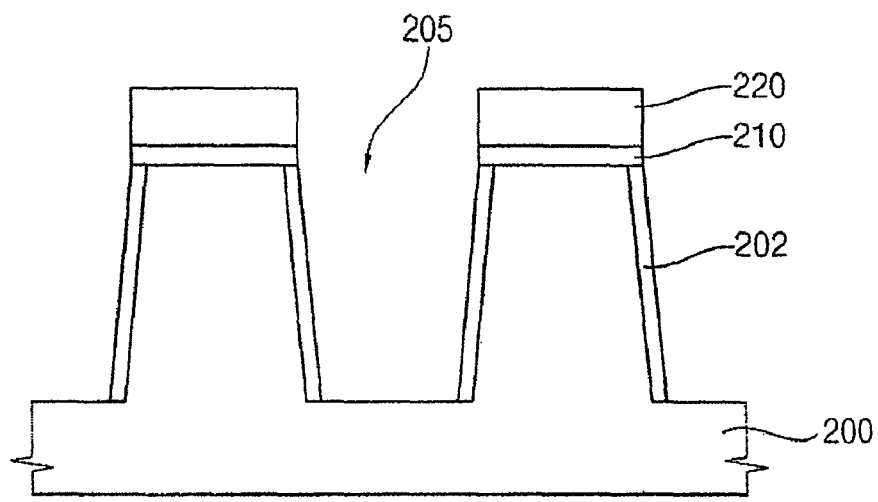
Figure 3D:
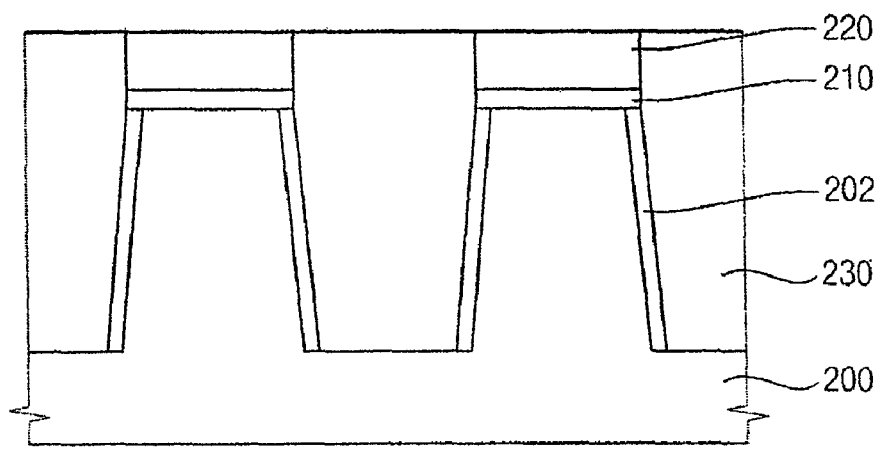
Figure 3E:
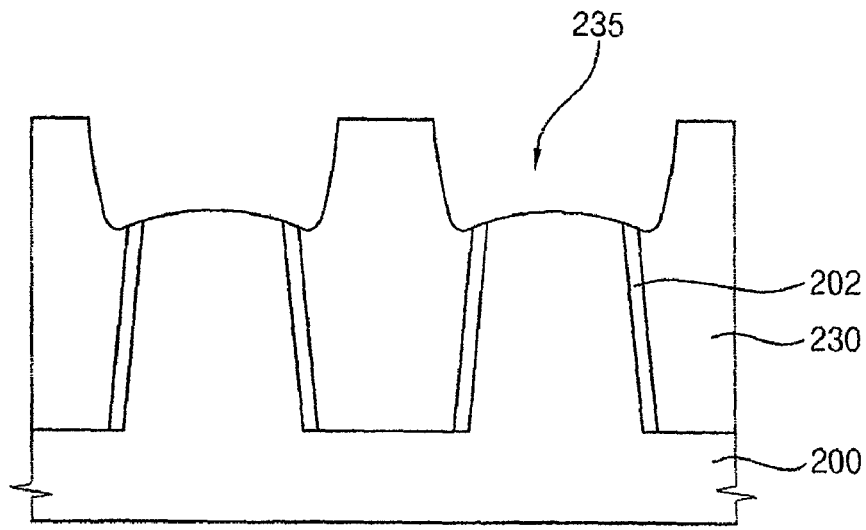
Figure 3F:
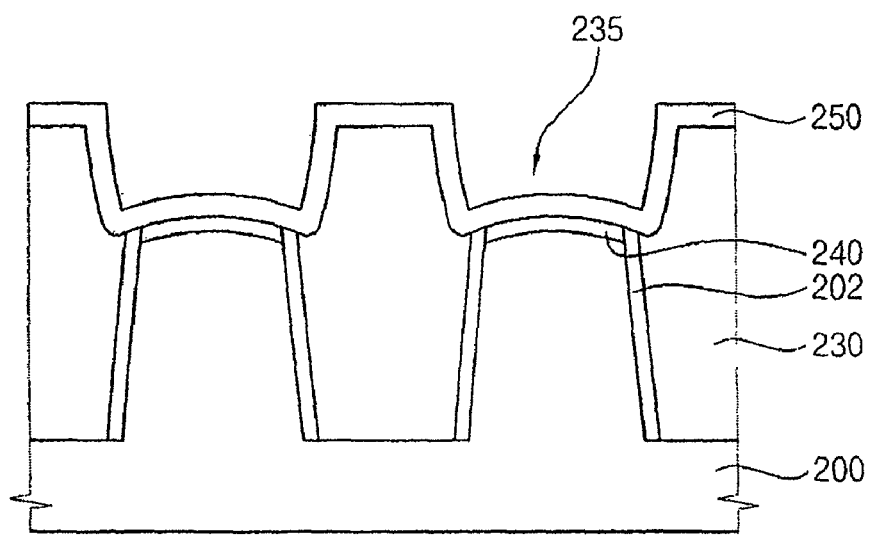
Figure 3G:
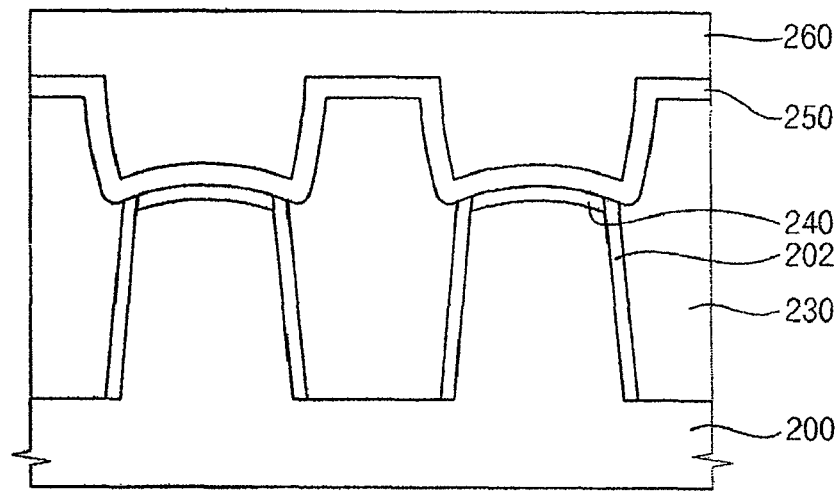
Figure 3H:
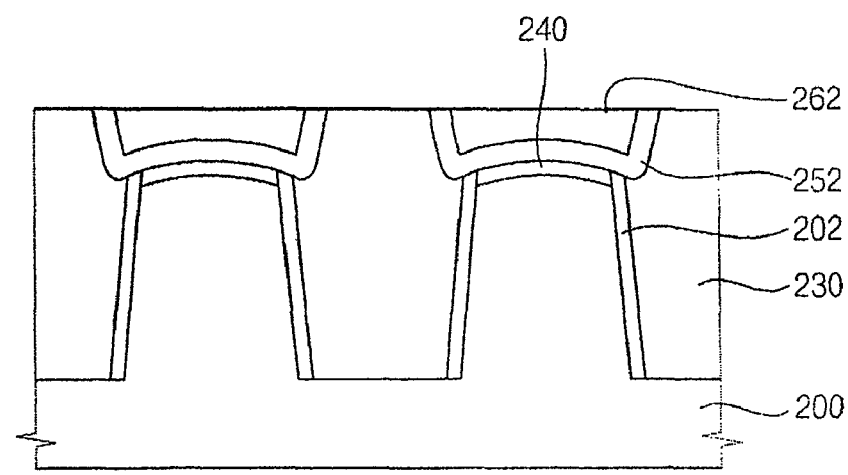
Figure 3I:
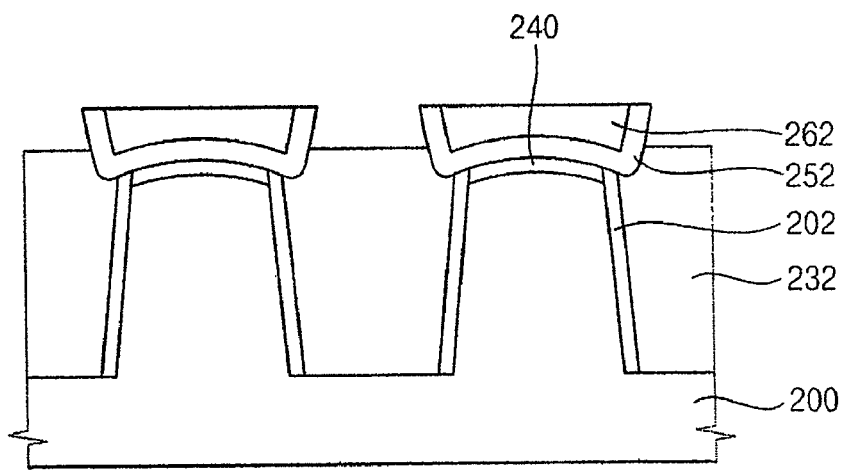
Figure 3J:
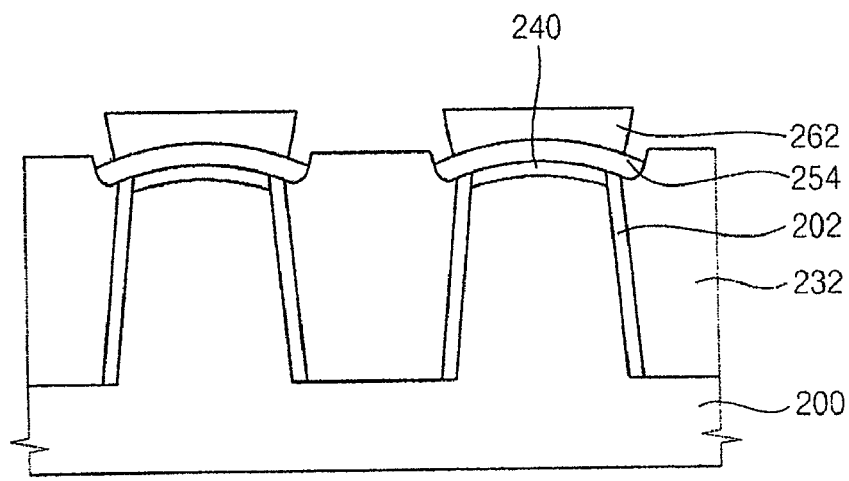
Figure 3K:
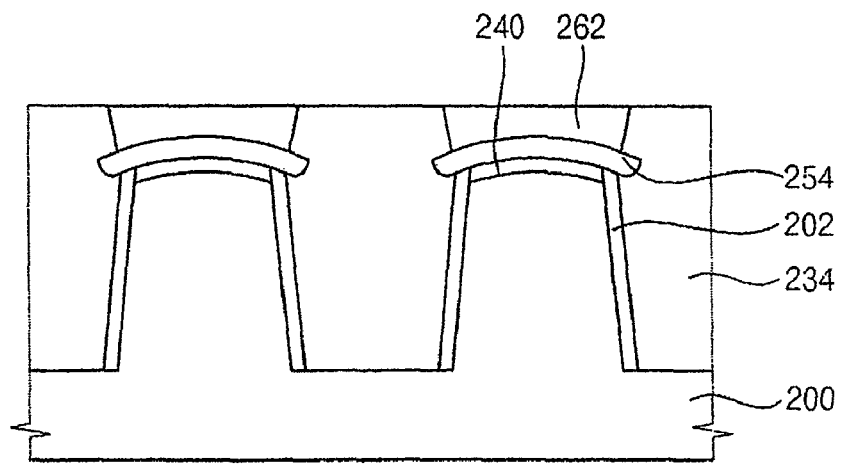
Figure 3L:
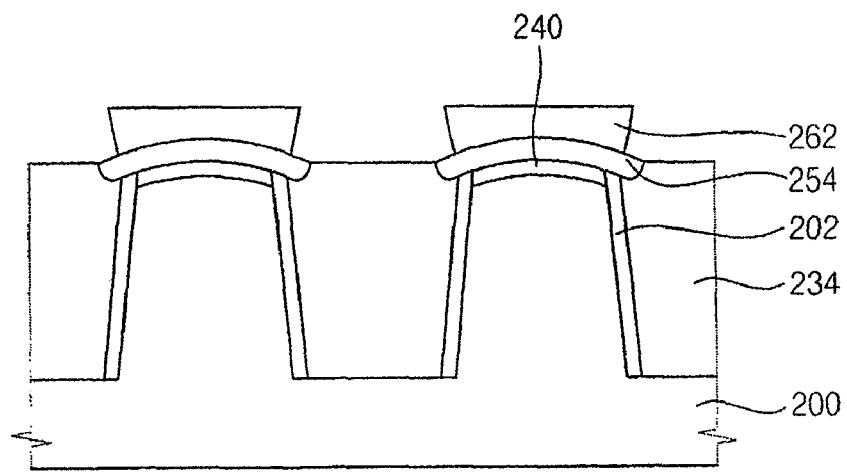
Figure 3M:
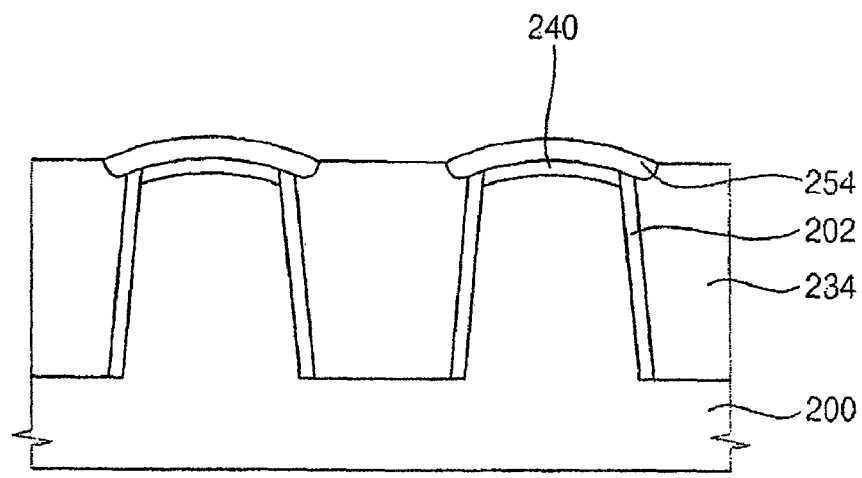
Figure 3N:
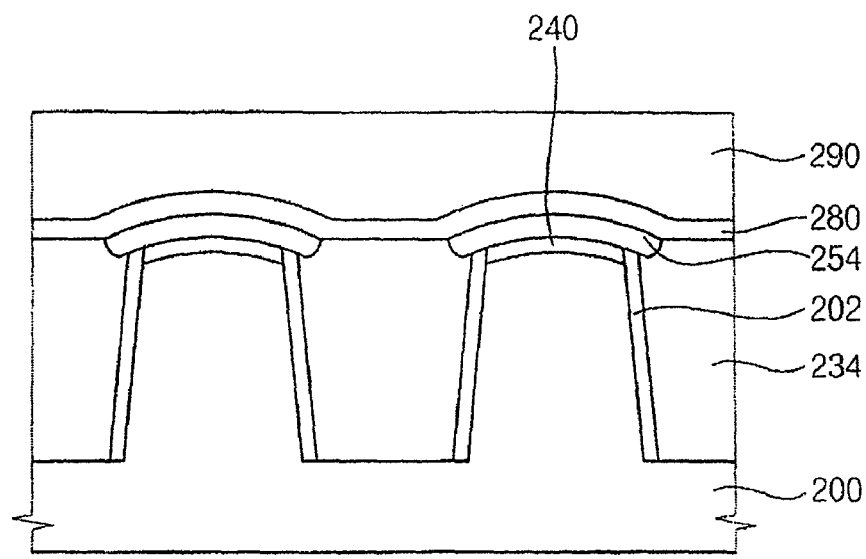

FIGS. 3A to 3N illustrate cross-sectional views of methods of manufacturing non-volatile memory devices in accordance with some embodiments.

Referring to FIG. 3A, a pad layer and a mask layer may be formed on a substrate 200. The substrate 200 may include a silicon substrate, a germanium substrate, a SOI substrate, a GOI substrate, etc. The substrate 200 may be divided into an active region and a field region. The pad layer may be formed by thermally oxidizing a top surface of the substrate 200. The pad layer may reduce or prevent crystal defects from being generated at the top surface of the substrate 200, and/or may reduce stress generated due to the direct contact between the top surface of the substrate 200 and the mask layer. The mask layer may be formed using a low pressure chemical vapor deposition (LPCVD) process using a nitride. An anti-reflective layer (not shown) may be further formed on the mask layer, so that a photoresist pattern (not shown) may keep a good vertical profile even after performing a photolithography process.

The photoresist pattern may be formed on the mask layer to cover the active region of the substrate 200 and expose the field region of the substrate 200. The mask layer and the pad layer may be partially etched by an etching process using the photoresist pattern as an etching mask, thereby forming a pad layer pattern 210 and a mask 220 sequentially stacked on the active region of the substrate 200. The photoresist pattern may be removed by an ashing process and/or a stripping process.

Referring to FIG. 3B, an upper portion of the field region of the substrate 200 may be partially removed by a dry etch process using the mask 220 and the pad layer pattern 210 as an etching mask, thereby forming a trench 205.

Referring to FIG. 3C, an oxide layer 202 may be formed on a sidewall of the trench 205, so that damage to the sidewall of the trench 205 generated during the dry etch process may be at least partially cured. The oxide layer 202 may be formed by thermally oxidizing the sidewall of the trench 205. Alternatively, the oxide layer 202 may not be formed.

A liner (not shown) may be further formed on a bottom of the trench 205, the oxide layer 202, the pad layer pattern 210 and the mask 220. The liner may be formed using silicon nitride. The liner may enhance the adhesion of a first preliminary isolation layer 230 to the trench 205, and to reduce or prevent a leakage current from flowing into the substrate 200.

Referring to FIG. 3D, the first preliminary isolation layer 230 may be formed on the substrate 200 to fill up the trench 205. The first preliminary isolation layer 230 may be formed by a chemical vapor deposition (CVD) process using a material having good gap-filling characteristics such as USG oxide, $O_3$-TEOS oxide, HDP oxide, etc. Additionally, an annealing process may be performed at a temperature of about 800° C. to about 1050° C. under an atmosphere of an inert gas, so that the first preliminary isolation layer 230 may be densified and an etching rate thereof with respect to an etching solution used in a successive wet etching process may be reduced.

An upper portion of the first preliminary isolation layer 230 may be planarized until the mask 220 may be exposed by a chemical mechanical polishing (CMP) process, an etch-back process, or a combination process thereof.

Referring to FIG. 3E, the mask 220 may be removed by a stripping process and/or a wet etching process. The stripping process and/or the wet etching process may be performed using phosphoric acid solution. Additionally, the pad layer pattern 210 may be removed by a wet etching process. The wet etching process may be performed using fluoride acid solution. Thus, an opening 235 exposing the active region of the substrate 200 may be formed. The stripping process and the wet etching process may be performed in an isotropic manner, and thus the first preliminary isolation layer 230 and the oxide layer 202 may be partially removed together with the mask 220 and the pad layer pattern 210. As a result, the opening 235 may have a peripheral portion having a depth greater than that of a central portion thereof.

Referring to FIG. 3F, a tunnel insulation layer 240 may be formed on the active region of the substrate 200 exposed by the opening 235. The tunnel insulation layer 240 may be formed by thermally oxidizing a top surface of the substrate 200.

Additionally, a preliminary charge trapping layer 250 may be formed on a bottom and a sidewall of the opening 235 and the first preliminary isolation layer 230. The preliminary charge trapping layer 250 may be formed using silicon nitride. In an example embodiment, the preliminary charge trapping layer 250 may be formed by depositing silicon oxide and performing a plasma treatment on the deposited silicon oxide using a gas including nitrogen. Alternatively, the preliminary charge trapping layer 250 may be formed by depositing silicon nitride. When a floating gate flash memory is manufactured, instead of the preliminary charge trapping layer 250, a floating gate layer may be formed using doped polysilicon and/or a metal silicide. The floating gate layer may be formed by an LPCVD process.

Referring to FIG. 3G, an etch stop layer 260 may be formed on the preliminary charge trapping layer 250 to fill the remaining portion of the opening 235. The etch stop layer 260 may be formed using polysilicon or amorphous silicon. Alternatively, the etch stop layer 260 may be formed using boron silicate glass (BSG) oxide, USG oxide, middle temperature oxide (MTO), etc., by a CVD process. The etch stop layer 260 may prevent a portion of the preliminary charge trapping layer 250 on the active region from being etched when a charge trapping layer 254 (see FIG. 3J) may be subsequently formed.

Referring to FIG. 3H, upper portions of the etch stop layer 260 and the preliminary charge trapping layer 250 may be removed to expose the first preliminary isolation layer 230. Thus, the etch stop layer 260 may be transformed into an etch stop layer pattern 262. Meanwhile, in order to prevent the preliminary charge trapping layer 250 from falling down due to the removal of a portion of the first preliminary isolation layer 230 in a subsequent process, an upper portion of the first preliminary isolation layer 230 may be also removed together with the etch stop layer 260 and the preliminary charge trapping layer 250 in the above process so that a preliminary charge trapping layer 252 may have a reduced height. The upper portions of the etch stop layer 260 and the preliminary charge trapping layer 250 may be removed by a CMP process, an etch-back process, or a combination process thereof.

Referring to FIG. 3I, an upper portion of the first preliminary isolation layer 230 may be removed until a top surface of the first preliminary isolation layer 230 has a height substantially the same as that of the lowermost point of the etch stop layer pattern 262, so that an upper portion of the preliminary charge trapping layer 252 may be exposed. Thus, the first preliminary isolation layer 230 may be transformed into a second preliminary isolation layer 232. The upper portion of the first preliminary isolation layer 230 may be removed by a dry etch process.

Referring to FIG. 3J, the exposed upper portion of the preliminary charge trapping layer 252 may be removed by an isotropic etching process to form a first charge trapping layer 254. The isotropic etching process may be performed by a wet etching process or by a chemical dry etching process. The upper portion of the preliminary charge trapping layer 252 may be etched not only in a vertical direction but also in a horizontal direction, so that a portion of the preliminary charge trapping layer 252 under a plane extending from a top face of the second isolation layer 232 may be removed. Thus, the first charge trapping layer 254 may have a uniform thickness regardless of a specific location. Meanwhile, a portion of the preliminary charge trapping layer 252 covered by the etch stop layer pattern 262 may be not removed.

Referring to FIG. 3K, a first isolation layer 234 may be formed to cover the second preliminary isolation layer 232, an exposed portion of the first charge trapping layer 254 and a sidewall of the etch stop layer pattern 262. In some embodiments, the first isolation layer 234 may be formed using a material substantially the same as that of the second preliminary isolation layer 232, and thus the first isolation layer 234 may contain the second preliminary isolation layer 232. That is, the first isolation layer 234 may be formed by a CVD process using USG oxide, $O_3$-TEOS oxide, HDP oxide, etc. In some embodiments, the process for forming the first isolation layer 234 may be omitted.

Referring to FIG. 3L, an upper portion of the first isolation layer 234 may be removed until the first isolation layer 234 has a height substantially the same as that of a top surface of the peripheral portion of the first charge trapping layer 254. The upper portion of the first isolation layer 234 may be removed by a dry etch process. If the process for forming the first isolation layer 234 is omitted, an upper portion of the second preliminary isolation layer 232 may be removed until the second preliminary isolation layer 232 has a height substantially the same as that of the peripheral portion of the first charge trapping layer 254, so that the first isolation layer 234 may be formed.

Referring to FIG. 3M, the etch stop layer pattern 262 may be removed. The etch stop layer pattern 262 may be removed by a wet etching process. In this case, an isotropic etching process may be further performed to smoothen a top surface of the first charge trapping layer 254. Alternatively, the etch stop layer pattern 262 may be removed after the process illustrated with reference to FIG. 3J or 3K.

Referring to FIG. 3N, a dielectric layer 280 may be formed on the first charge trapping layer 254 and the first isolation layer 234. The dielectric layer 280 may be formed by a CVD process and/or an ALD process using a high-k material. The dielectric layer 280 may be formed to have a multi-stack structure including an oxide layer/nitride layer/oxide layer structure. A gate electrode 290 may be formed on the dielectric layer 280. The gate electrode 290 may be formed using doped polysilicon and/or a metal silicide. These may be used alone or in a combination thereof. The metal silicide may include tungsten silicide ($WSi_x$), titanium silicide ($TiSi_x$), cobalt silicide ($CoSi_x$), tantalum silicide ($TaSi_x$), etc.

By performing the processes described above, a flash memory device including the tunnel insulation layer 240, the first charge trapping layer 254, the dielectric layer 280 and the gate electrode 290 may be manufactured.

FIGS. 4A to 4F illustrate cross-sectional views of methods of manufacturing flash memory devices in accordance with further embodiments.

First, processes substantially the same as, or very similar to, those illustrated with reference to FIGS. 3A to 3H are performed, and then following processes illustrated with reference to FIGS. 4A to 4F are performed.

Figure 4A:
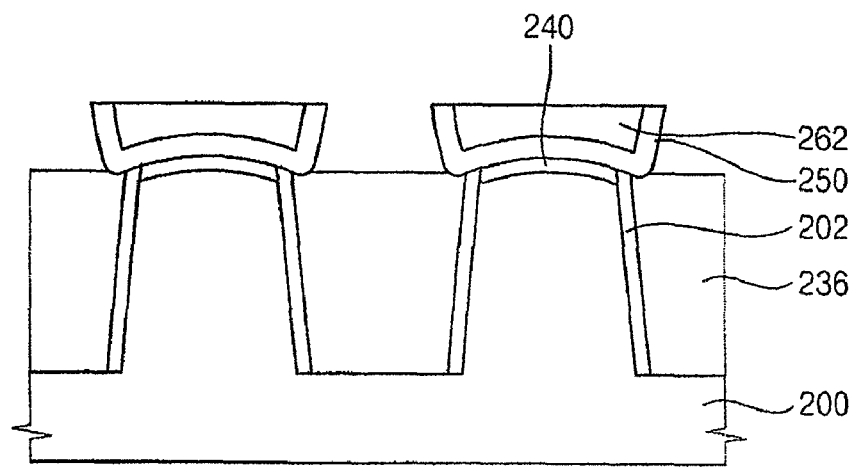
FIGS. 4A to 4F illustrate cross-sectional views of methods of manufacturing flash memory devices in accordance with further embodiments.

Referring to FIG. 4A, an upper portion of the first preliminary isolation layer 230 may be removed, so that a third preliminary isolation layer 236 having a height substantially the same as, or higher than, the lowermost point of the preliminary charge trapping layer 250 may be formed from the first preliminary isolation layer 230, and a portion of the preliminary charge trapping layer 250 may be exposed. The upper portion of the first preliminary isolation layer 230 may be removed by a dry etch process.

Figure 4B:
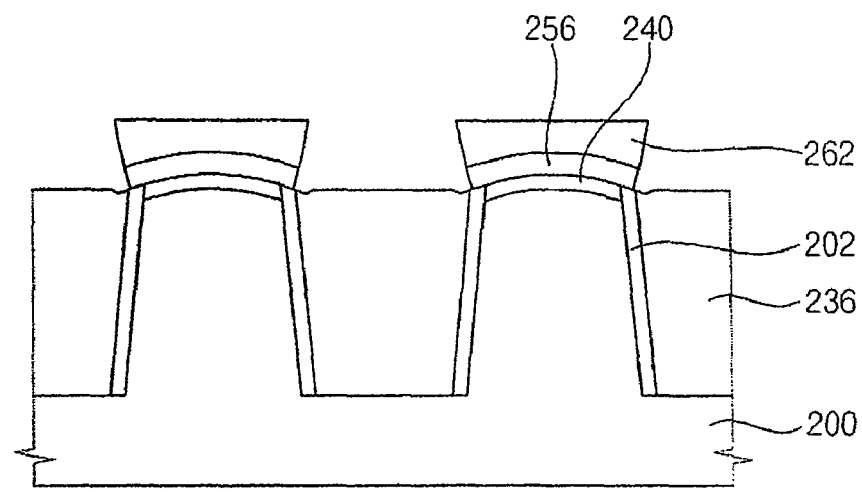

Referring to FIG. 4B, the exposed portion of the preliminary charge trapping layer 252 may be removed by an isotropic etching process to form a second charge trapping layer 256. The isotropic etching process may be performed by a wet etching process or by a chemical dry etch process. The upper portion of the preliminary charge trapping layer 250 may be etched not only in a vertical direction but also in a horizontal direction, so that a portion of the preliminary charge trapping layer 250 that has not been covered by the etch stop layer pattern 262 may be removed. Thus, the second charge trapping layer 256 may have a uniform thickness regardless of a specific location. The first charge trapping layer 254 shown in FIG. 3J has a portion that is exposed outwardly and simultaneously not covered by the etch stop layer pattern 262, while the second charge trapping layer 256 in FIG. 4B does not have a portion that is exposed outwardly and simultaneously not covered by the etch stop layer pattern 262.

Figure 4C:
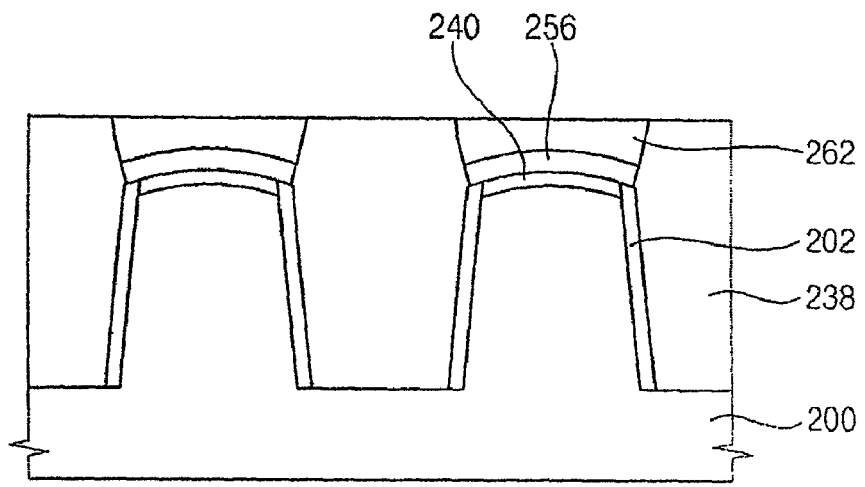

Referring to FIG. 4C, a second isolation layer 238 may be formed to cover the third preliminary isolation layer 236, an exposed portion of the second charge trapping layer 256 and a sidewall of the etch stop layer pattern 262. In some embodiments, the second isolation layer 238 may be formed using a material substantially the same as that of the third preliminary isolation layer 236, and thus the second isolation layer 238 may contain the third preliminary isolation layer 236. That is, the second isolation layer 238 may be formed by a CVD process using USG oxide, O$_3$-TEOS oxide, HDP oxide, etc.

Figure 4D:
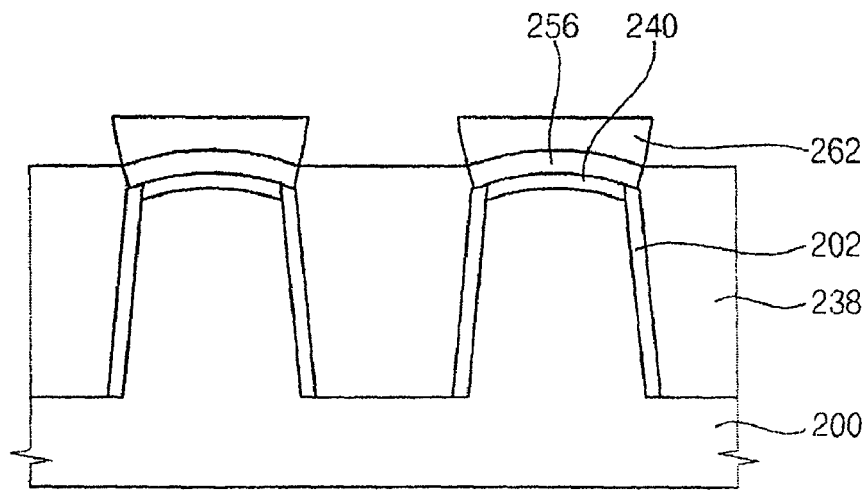

Referring to FIG. 4D, an upper portion of the second isolation layer 238 may be removed until the second isolation layer 238 has a height substantially the same as that of a top surface of the peripheral portion of the second charge trapping layer 256. The upper portion of the second isolation layer 238 may be removed by a dry etch process.

Figure 4E:
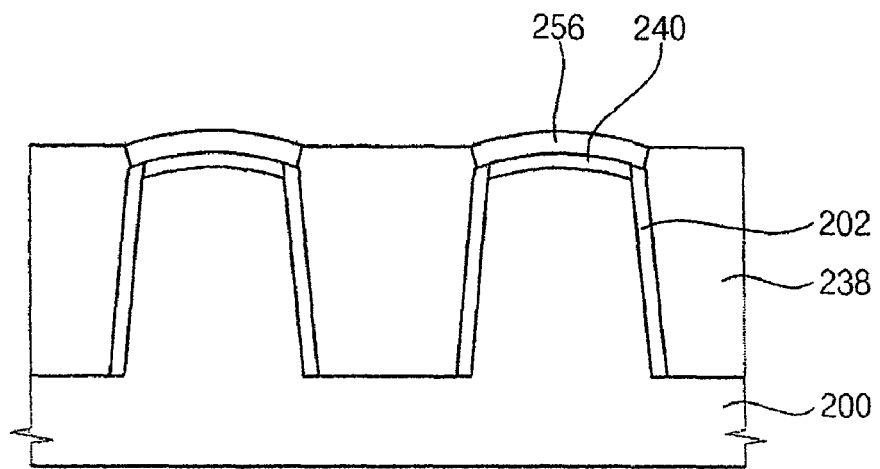

Referring to FIG. 4E, the etch stop layer pattern 262 may be removed. The etch stop layer pattern 262 may be removed by a wet etching process. An isotropic etching process may be further performed to smoothen a top surface of the second charge trapping layer 256. In example embodiments, the process illustrated with reference to FIG. 4D and that of FIG. 4E may be replaced with each other, i.e., the order of performing the two processes may be reversed.

Figure 4F:
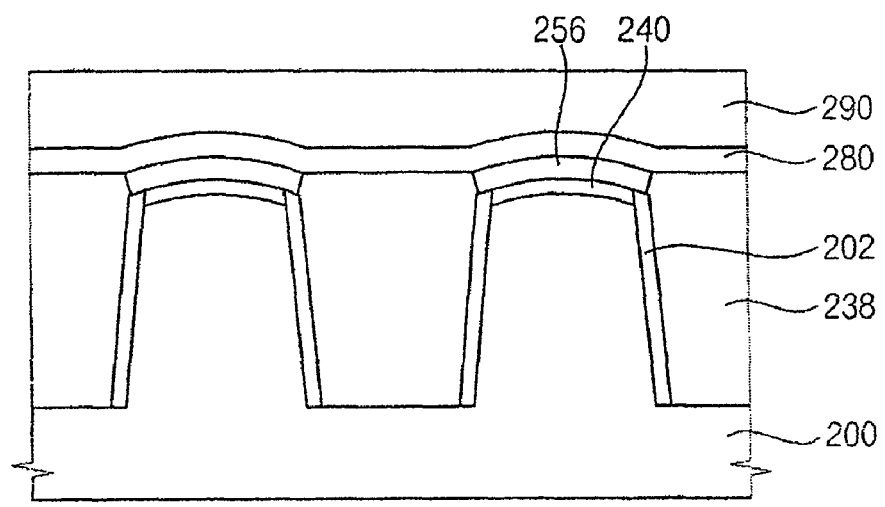

Referring to FIG. 4F, a dielectric layer 280 may be formed on the second charge trapping layer 256 and the second isolation layer 238, and a gate electrode 290 may be formed on the dielectric layer 280.

By performing the processes described above, a flash memory device including the tunnel insulation layer 240, the second charge trapping layer 256, the dielectric layer 280 and the gate electrode 290 may be manufactured.

According to some embodiments, when a charge trapping layer is formed, after removing an upper portion of a preliminary isolation layer until a portion of a preliminary charge trapping layer may be exposed, the exposed portion of the preliminary charge trapping layer may be removed by an isotropic etching process. Thus, the charge trapping layer may have a more uniform thickness, and the flash memory device including the charge trapping layer may have more uniform operating characteristics.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor memory device, the method comprising:
    forming a trench in a substrate, the trench defining an active region on the substrate;
    forming an isolation layer in the trench;
    forming a tunnel insulation layer on the active region;
    forming a preliminary charge trapping layer on the tunnel insulation layer;
    forming an etch stop layer on the preliminary charge trapping layer, wherein a portion of the preliminary charge trapping layer is not covered by the etch stop layer to form exposed top portions of the preliminary charge trapping layer;
    removing an upper portion of the isolation layer, after forming the etch stop layer, so that side portions of the preliminary charge trapping layer are exposed;
    removing the exposed top and side portions of the preliminary charge trapping layer to form a charge trapping layer having a uniform thickness;
    forming a dielectric layer on the charge trapping layer; and
    forming a gate electrode on the dielectric layer.

2. The method as claimed in claim 1, wherein forming the charge trapping layer includes performing an isotropic etching process on the preliminary charge trapping layer.

3. The method as claimed in claim 2, further comprising removing the etch stop layer after removing the exposed top and side portions of the preliminary charge trapping layer.

4. The method as claimed in claim 1, further comprising, prior to forming the tunnel insulation layer:
    sequentially forming a pad layer pattern and a mask on the substrate;
    partially removing the substrate using the mask and the pad layer pattern as an etching mask to form the trench; and
    removing the mask and the pad layer pattern to form an opening exposing the active region, wherein the tunnel insulation layer is formed on the active region exposed by the opening.

5. The method as claimed in claim 4, wherein removing the mask and the pad layer pattern to form the opening includes performing a wet etching process, and a portion of the isolation layer is removed in the wet etching process.

6. The method as claimed in claim 5, wherein the preliminary charge trapping layer is formed on a bottom and a sidewall of the opening.

7. The method as claimed in claim 1, wherein removing the upper portion of the isolation layer includes removing the upper portion of the isolation layer until a top surface of the isolation layer has a height substantially the same as a height of a lowermost portion of the etch stop layer.

8. The method as claimed in claim 1, wherein removing the upper portion of the isolation layer includes removing the upper portion of the isolation layer until a top surface of the isolation layer has a height substantially the same as, or higher than, that of a lowermost point of the preliminary charge trapping layer.

9. The method as claimed in claim 1, further comprising, before forming the dielectric layer, forming a second isolation layer in the trench having an upper surface at a height substantially the same as a height of a top surface of a peripheral portion of the charge trapping layer.

10. A method of manufacturing a semiconductor memory device, the method comprising:
    forming a mask on a substrate;
    partially removing the substrate using the mask as an etching mask to form a trench defining an active region in the substrate;
    forming an isolation layer in the trench;
    removing the mask to form an opening exposing the active region;
    forming a preliminary charge trapping layer on a bottom and a sidewall of the trench and on the isolation layer;
    forming an etch stop layer on the preliminary charge trapping layer;
    removing an upper portion of the etch stop layer and an upper portion of the preliminary charge trapping layer on the isolation layer;
    removing a portion of the isolation layer;
    partially removing the preliminary charge trapping layer to form a charge trapping layer having a substantially uniform thickness;
    forming a dielectric layer on the charge trapping layer; and
    forming a gate electrode on the dielectric layer.

* * * * *